(12) United States Patent
Hong et al.

(10) Patent No.: US 7,392,492 B2
(45) Date of Patent: Jun. 24, 2008

(54) MULTI-FORMAT CONSISTENCY CHECKING TOOL

(75) Inventors: Qiang Hong, San Jose, CA (US); Jing Jiang, Stanford, CA (US); Kevin D. Jones, Hayward, CA (US); Kathryn M. Mossawir, Stanford, CA (US); Thomas J. Sheffler, San Francisco, CA (US); Paul Wong, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 216 days.

(21) Appl. No.: 11/242,598

(22) Filed: Sep. 30, 2005

(65) Prior Publication Data

US 2007/0079267 A1    Apr. 5, 2007

(51) Int. Cl.
*G06F 17/50* (2006.01)

(52) U.S. Cl. .............................. 716/5; 716/11
(58) Field of Classification Search ................. 716/4–5, 716/11
See application file for complete search history.

(56) References Cited

U.S. PATENT DOCUMENTS

| | | | | |
|---|---|---|---|---|
| 5,493,508 A | * | 2/1996 | Dangelo et al. | 716/5 |
| 5,544,067 A | * | 8/1996 | Rostoker et al. | |
| 5,623,418 A | * | 4/1997 | Rostoker et al. | |
| 5,867,399 A | * | 2/1999 | Rostoker et al. | |
| 6,148,277 A | * | 11/2000 | Asava et al. | 703/22 |
| 6,275,976 B1 | * | 8/2001 | Scandura | |
| 6,427,146 B1 | * | 7/2002 | Chu | |
| 6,505,328 B1 | * | 1/2003 | Van Ginneken et al. | |
| 6,530,072 B1 | * | 3/2003 | Hagerman et al. | 716/18 |
| 7,000,213 B2 | * | 2/2006 | Banerjee et al. | |
| 2003/0196194 A1 | * | 10/2003 | Johns et al. | |
| 2004/0044514 A1 | * | 3/2004 | Granny et al. | |
| 2004/0117746 A1 | * | 6/2004 | Narain et al. | 716/4 |
| 2004/0230681 A1 | * | 11/2004 | Strassner et al. | |
| 2005/0210433 A1 | * | 9/2005 | Clarke et al. | 716/5 |
| 2006/0117279 A1 | * | 6/2006 | Van Ginneken et al. | |
| 2006/0212837 A1 | * | 9/2006 | Prasad | 716/5 |
| 2006/0218516 A1 | * | 9/2006 | McLain et al. | 716/10 |
| 2006/0248519 A1 | * | 11/2006 | Jaeger et al. | |
| 2007/0038431 A1 | * | 2/2007 | Yoon et al. | |

* cited by examiner

*Primary Examiner*—Stacy Whitmore
(74) *Attorney, Agent, or Firm*—Hickman Palermo Truong & Becker, LLP; Brian D. Hickman

(57) ABSTRACT

A method and system for performing consistency checking of one or more design representations having different design types. A translator for each design type obtains information from each design needed to evaluate rules that are design type-neutral. The described examples also allow a user to add rules using predefined rule terms. In addition, certain examples allow the user to add terms to the rule set and to make new rules with the added terms. Each new term added to a rule set has a corresponding abstraction function in a translator for each design type. Thus, the abstraction functions are not design type-neutral.

19 Claims, 9 Drawing Sheets

Consistency Checker Receiving Multiple Types of Design Reps

Consistency Checker Receiving Multiple Types of Design Reps

Consistency Checking

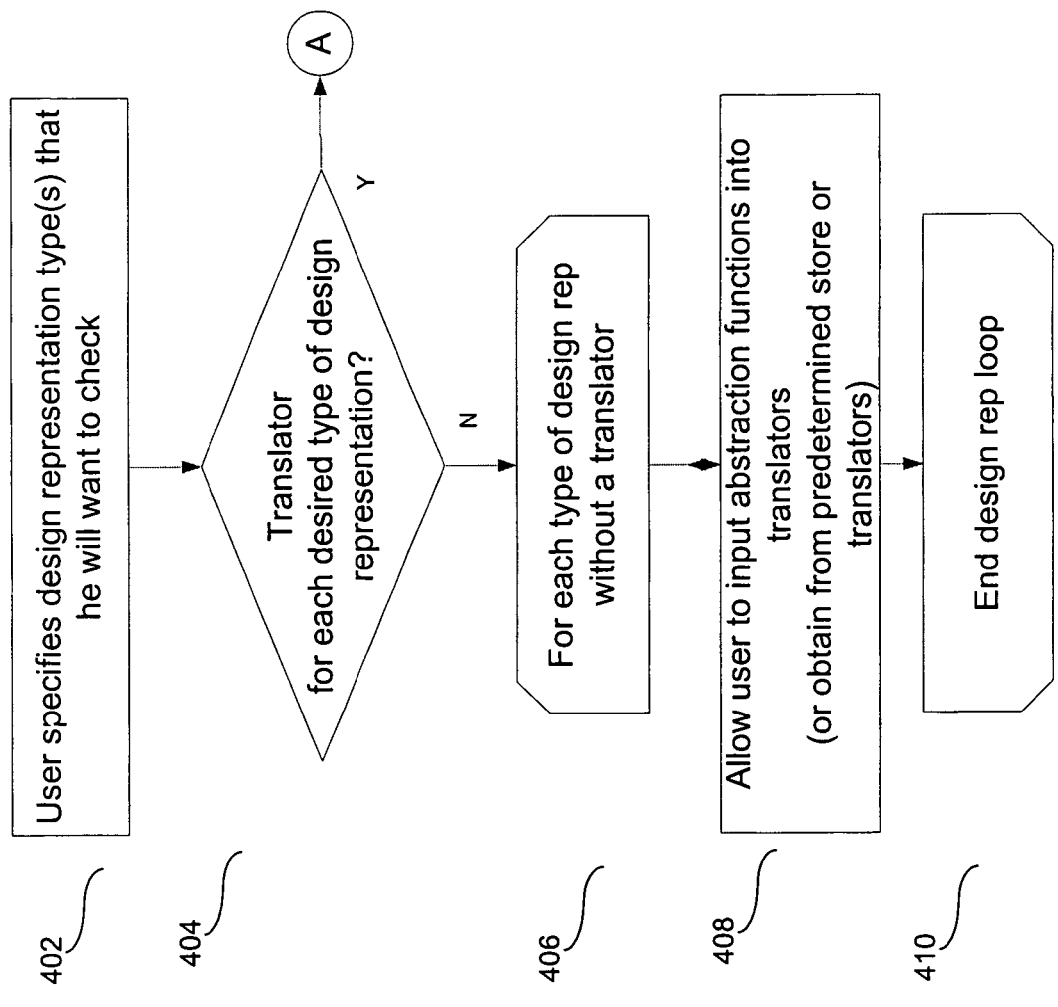
Fig. 4(a) Consistency Checking Initialization

More Consistency Checking Initialization

Example Screen Shot of Rule Input by User

Enter name of term: _____

Enter name of translators that understand this term for each design type known to this tool:
Verilog: _____
Pathmill: _____

Enter name of rule set in which to add term: _____

650
651
652
656

Fig. 6
Example Screen Shot of Defining a New Rule Term

```
module Vmodel (in, out, clk) ;
input in;
output out; reg out;
input clk;
...
always @(posedge clk) out=in ;
...
endmodule
```

Fig. 7(b)
Example of Design Representation,
Design Type of Verilog

```
int Cmodel(...)
{vpiHandle inh, outh, clkh;
inh = vpi_scan (xx,...)
outh = vpi_scan (xx, ...)
clkh = vpi_scan(XX,...)
...
vpi_register(clkh, "risingedge", clkfn);
...
} int clkfn(...)
{
s_vpi_value inv;
...
vpi_get_value(inh,&inv);
...
```

Fig. 7(a)
Example of Design Representation,
DesignType of C

Example Abstraction Function in Translator For Design Type of Verilog

Example Abstraction Function In Translator For Design Type of C

MULTI-FORMAT CONSISTENCY CHECKING TOOL

BACKGROUND OF THE INVENTION

As IC design evolves, tools are created to solve new design challenges. These tools produce new and different formats to represent the design. When this occurs, conventional tools lack the ability to check the consistency of a design encoded in several different design representations.

It would be desirable to implement a method, system, and tool that is able to perform syntax and semantic checks for and against a wide variety of design representations.

BRIEF DESCRIPTION OF THE DRAWINGS

The teachings described herein can be readily understood by considering the following detailed description in conjunction with the accompanying drawings. Like reference numerals are used for like elements in the accompanying drawings.

FIGS. 4(a) and 4(b) are flow charts showing a method of initializing a consistency checker, wherein a user can change the type of designs to be checked and can further change the terms included in rules of the checker.

FIG. 6 shows an example user interface that allows a user to add a new term to a rule set.

FIG. 7(a) shows a portion of an example design representation written in the C programming language.

FIG. 7(b) shows a portion of an example design representation written in the Verilog hardware description language.

The figures depict embodiments for purposes of illustration only. One can recognize from the following discussion that alternative embodiments of the structures and methods illustrated herein may be employed without departing from the principles described herein.

DETAILED DESCRIPTION OF EMBODIMENTS

The following paragraphs describe various embodiments of a multi-format consistency checker of one or more design representations having different formats. For example, a tool might check a layout view from the schematic database against a design representation created in a different tool that is used to verify timing. In this example, a checker engine can evaluate rules that are design type-neutral to determine whether the multiple design representations meet semantic and syntactic requirements. Because the information needed to evaluate a rule may be extracted from design representations of different design types, the translator abstraction functions may be design type specific. In this example, a user can add rules using predefined rule terms. The user may add terms to the rule set and to make new rules with the added terms. Each new term added may have a corresponding translator portion for each design type that acquires information from designs of the design type relating to the term.

Note, in the following description user means any person, persons, or software controlled by a person or persons.

Figure 1:
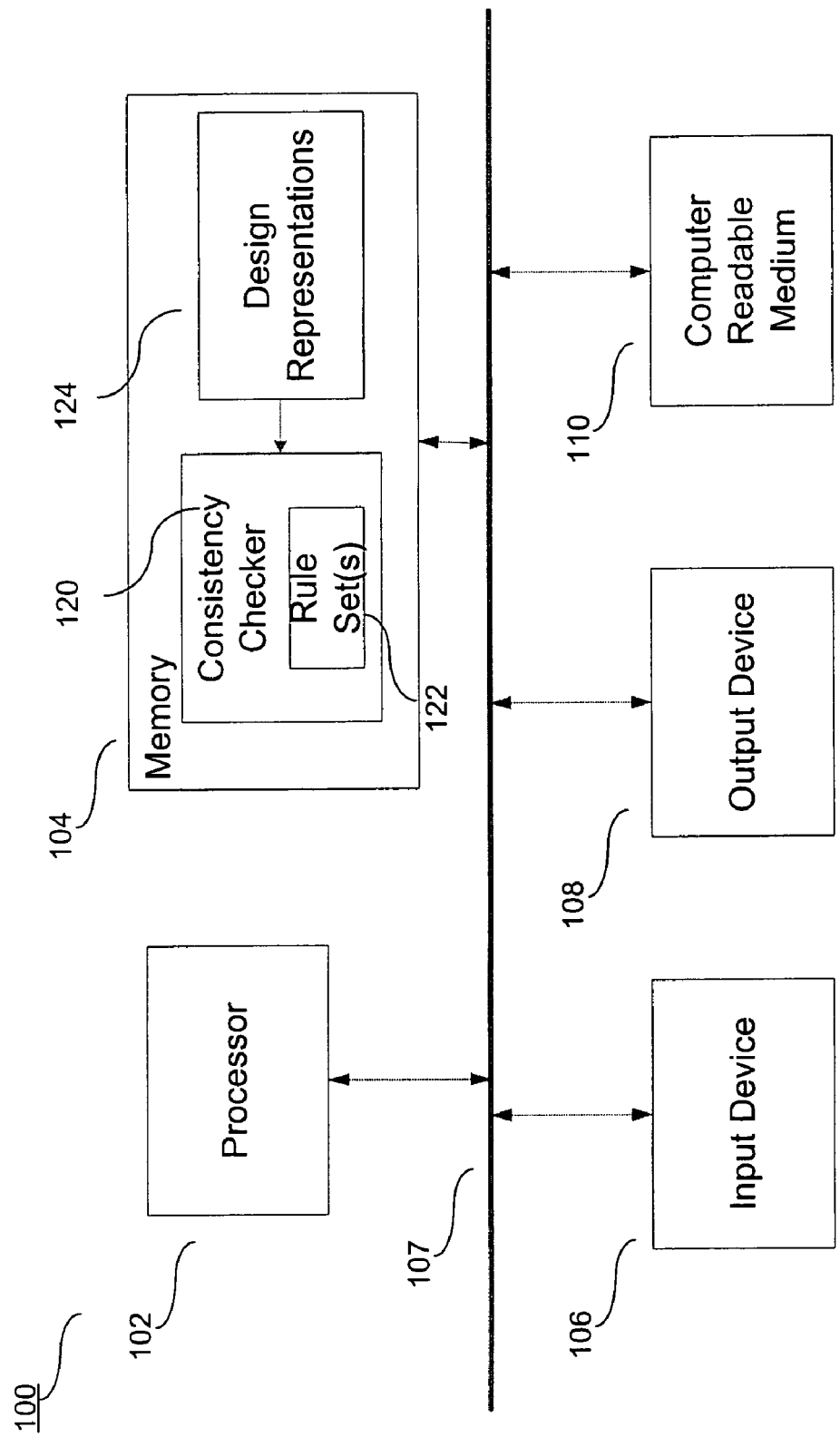
FIG. 1 is a block diagram of a data processing system incorporating a consistency checker.

FIG. 1 is a block diagram 100 of a data processing system incorporating a consistency checker. FIG. 1 shows a processor 102 coupled to a memory 104 via, for example, bus 107. Processor 102 executes instructions stored in memory 104, such as the instructions of consistency checker software 120. Memory 104 may include data such as one or more rule sets 122 and design representations 124 that have different formats from each other.

FIG. 1 also shows an input device 106, an output device 108, and a computer readable medium 110. Input device 106 provides a way for a user to communicate commands to the system (such as a commend to start consistency checker 120). Input device 106 also allows the user to add terms to the rule set 122 and to make modifications and additions to the translators 124, as described below in detail. Input device 106 can be any appropriate device, such as a keyboard, trackball, voice input system, scanner, and so on. Output device 108 provides a way to present results of the consistency checker and to interact with the user. Output device 108 can be any appropriate device, such as a display screen, a printer, and so on. Computer readable medium 110 is used, for example, to store at least consistency checker software 120 and in some embodiments, to store other contents of memory 104, such as rules 122 and translators 124, as needed by consistency checker 120. Computer readable medium 110 can be any appropriate medium used to store at least consistency checker 122. Computer readable medium 110 can include, without limitation, a memory, a memory chip, a floppy disk, a CD, a DVD, and signals on a wired or wireless network medium.

Moreover, in certain embodiments of the system, certain elements can be distributed over a network (not shown), such as the Internet, a LAN, a private network, or a wireless network. For example, while a data processing system 100 may contain a basic rule set, additional rule sets can be downloaded over the network. Similarly, additions to a rule set 122, such as additional rule terms and accompanying translators, can be stored using a distributed model. In some embodiments, all rules in such a system would be stored in a distributed fashion. In other embodiments, some rules would reside locally and some would reside on machines accessible through the network.

It is understood herein that system 100 can also include other elements not shown in the figure. System 100 is provided by way of example and is not intended to limit the invention in any way. The term "module" may be used throughout this document. As used herein, "module" indicates software having a particular functionality. The term module does not limit the invention to a particular organization or division of functionality and various implementations of the invention may use various internal organizational systems for software implementing the invention instead of, or in addition to, those shown in the Figure.

Moreover, some examples, including consistency checker 120, can be implemented in hardware, software, firmware, or any combination thereof. Examples can be a standalone tool or as a part of a larger system, wherein the consistency checker functionality and rule addition and change functionality is a part of a larger purpose of a tool. A consistency checker can check consistency of a design representation provided in any appropriate format. Many of the methods described herein can be run in parallel or in series, can be run on a server farm, multiple CPU machines, cluster, etc.

Figure 2:
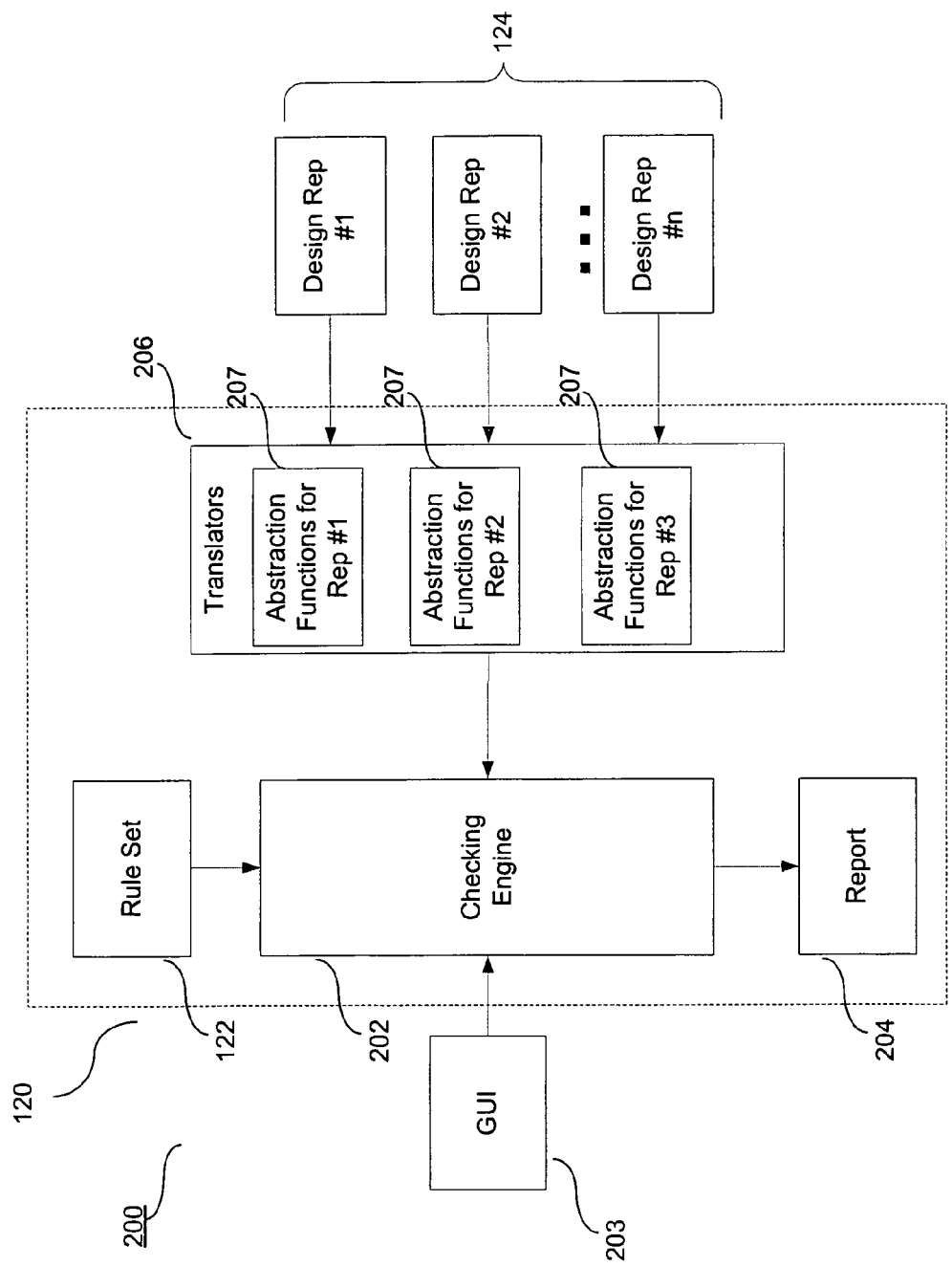
FIG. 2 is a block diagram showing details of the consistency checker of FIG. 1.

FIG. 2 is a block diagram 200 showing details of the consistency checker 120, which receives multiple types of design representations. For example, design representation #1 124 may be a Verilog RTL model, while design representation #2 may be a Pathmill black box timing model (Pathmill is a timing and analysis tool available from Synopsys, Inc.). For example, another design representation might be a model in the C programming language. It is contemplated that any type of design representation 124 can be used, assuming that appropriate abstraction functions 207 and translators 206 are constructed for them. While it may be possible that not all design representations are able to be checked for every possible rule, it is contemplated that most rules 122 will be able to be checked for most type of design representations 124. Special cases of rules that can only be checked for a subset of design types may also exist. The consistency checker will note these and inform users who try to perform invalid checks.

FIG. 2 shows a checking engine 202 that accesses one or more rules of rule sets 122. Checking engine 202 also receives input from a GUI 203 (or other appropriate input mechanism, such as a command line interface). Checking engine 202 also receives input from translators 206. In an embodiment, a separate translator 206 exists for each type of design representation that is to be checked. Each translator includes at least one abstraction function 207 for the type of design to be checked. Thus, checking engine 202 can perform consistency checks between design representations that are all of a same type (using a single translator 206) or can perform consistency checks between design representations of different types (using multiple translators 206 for each of the respective types of design representations). In an embodiment, checking engine 202 outputs a report 204 describing the result of the consistency checker 202 and/or further describing details of the process itself if the user so elects.

Figure 3:
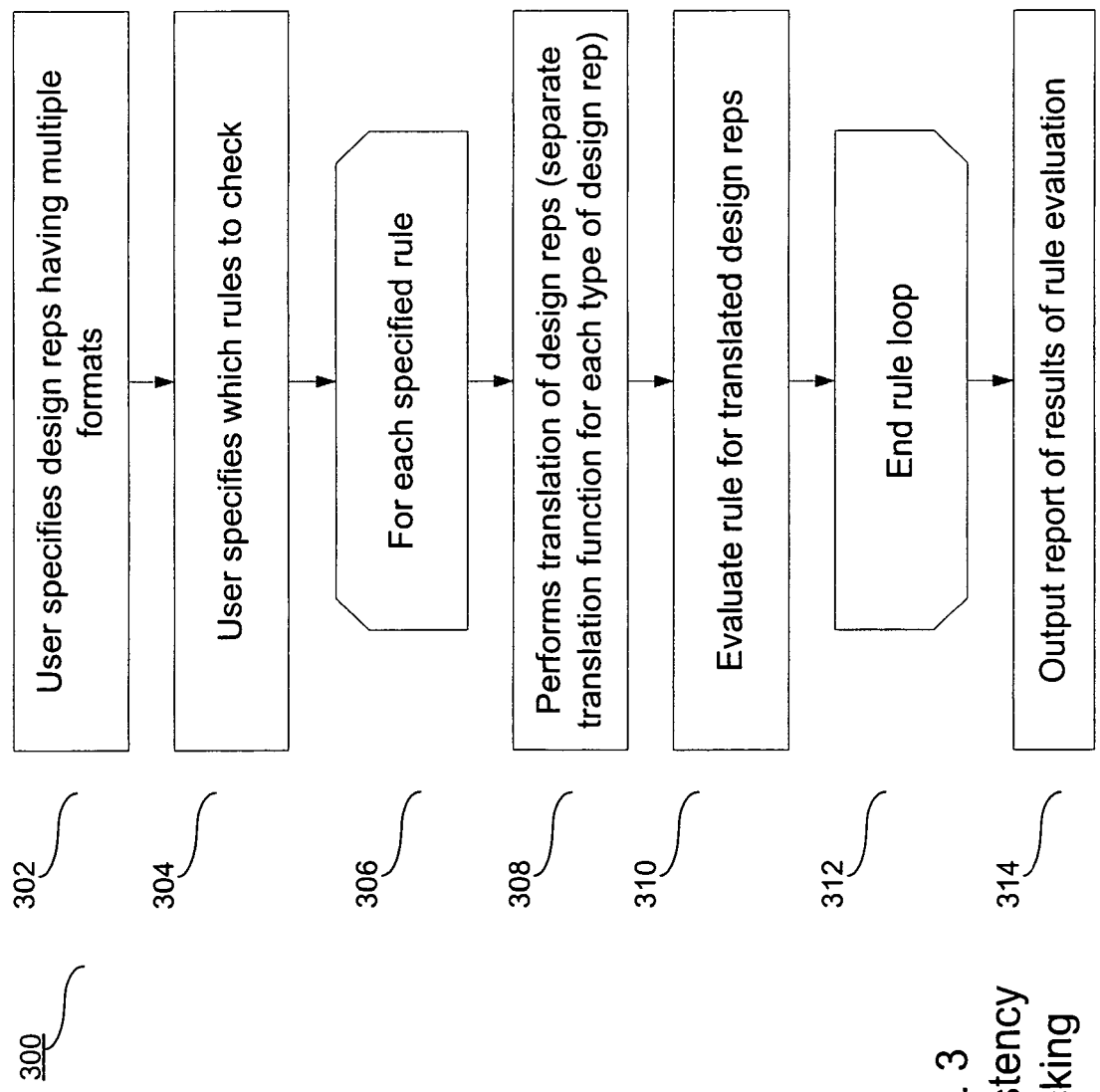
FIG. 3 is a flowchart showing a method of consistency checking.

The following paragraphs provide a more detailed explanation of the use of consistency checker 120. FIG. 3 is a flowchart 300 showing a method of consistency checking as managed by checking engine 202 of FIG. 2. A user specifies 302 one or more design representations, some of which may have formats different from others. For example, the user may specify design representations 124 using: Verilog RTL format, Pathmill format, the C programming language, the e verification, an HDL gate level netlist, a transistor level netlist, a Fastscan library model, and gate level models.

The user also specifies 304 which rules to evaluate during the consistency check. The user specifies rules by clicking on one of the rule sets or rules 122 displayed on an output screen. In other embodiments, the user may actually enter the body of the rules himself, either by typing them, or by selecting from available terms and operators that can be used to make the rule set (see, for example, FIG. 5). In an embodiment, the user may select rules from a current rule 122 set that is then checked for the received design representations. In other embodiments, all rules in a rule set will be checked for the input design representations 124. In other embodiments, multiple rule sets may be specified at one time. In other embodiments, different rules sets 122 (or parts of rule sets) may be specified for different subsets of the design rules 124 to be checked.

Figure 5:
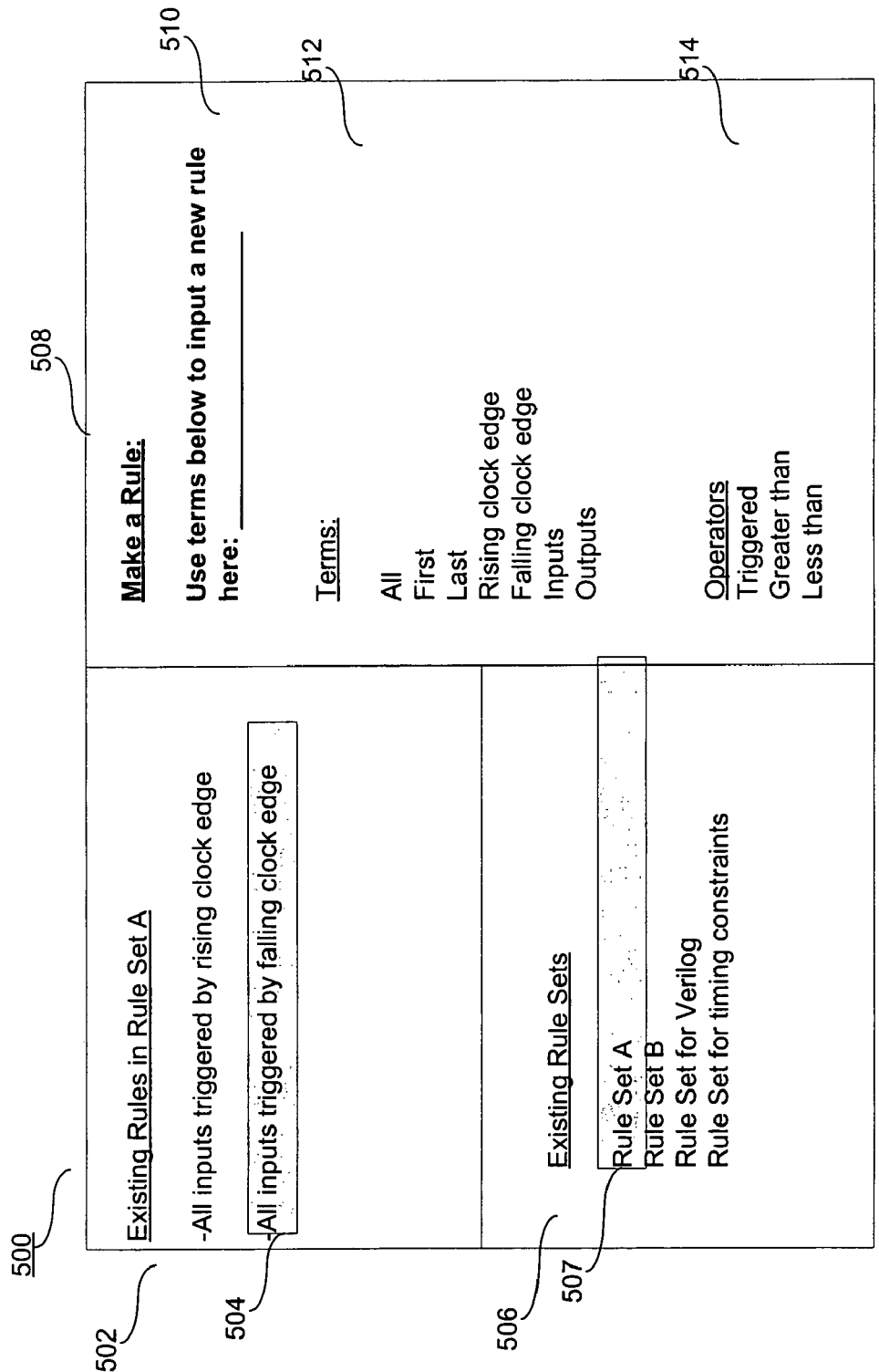
FIG. 5 shows an example of a user interface that allows a user to select rules to use during consistency checking.

FIG. 5 shows an example of a user interface 500 that allows a user to select rules to use during consistency checking. In the example, the user interface lists all existing rule sets 506 in the system. The user has selected a rule set A 507. Also listed are the individual rules 502 in a selected rule set 507, such as selected rule 504. In this example, the user has selected a particular rule 504 ("all inputs triggered by falling clock edge") that he wishes to apply during the consistency check of the multiple design representations 124. In addition, FIG. 5 shows an interface 508 that shows the user all defined terms for the selected rule set A 507. (Alternately, the user may select terms used in all rule sets, or in any rule set of the system).

The user is allowed 510 to use these defined rule terms 512, along with a special type of terms called operators 514, to define new rules to be added the current rule set 507. In the described embodiment, a term can only be part of the rule set when there exists a corresponding abstraction function in translator 206 that will identify aspects of design representations 124 relating to that term. Thus, for example, because "rising edge" is a term in rule set 502, there exists a predetermined abstraction function in each of translators 206 that will determine information relating to inputs triggered by a rising clock edge for each currently accepted type of design representation 124. If this is not the case for a particular term, certain embodiments will note that some types of design representations 124 cannot be checked using this term.

Returning to FIG. 3, once the user has specified the design representations 124 to check and has specified the rules 122 to check, checking engine 202 loops 306, 312 through the specified rules 122 to apply them to the design representations. For each rule, the translator abstraction function 206, 207 corresponding to each design specification 124 performs translation 308 of the corresponding design representation(s) to generate the information needed to evaluate the rule. For example, if the rule is "all inputs are triggered by rising clock edge," the translator 206 will determine whether this is true for each input design representation 124 corresponding to the translator's type.

Once translation is complete, the rule is evaluated 310 to see whether it evaluates to true for the input design representations 124. In some embodiments, rules may evaluate to Boolean values. In other embodiments, rules may have Boolean predicates and additional actions associated with those predicates (for example, "If all inputs triggered by rising edge, do <action>.") If all rules selected by the user evaluate to "True," then the consistency checking operation is complete and the design is consistent, at least for the checks performed. A report 314 showing the consistency or lack thereof of the design representations is output by checking engine 202.

Figure 4B:
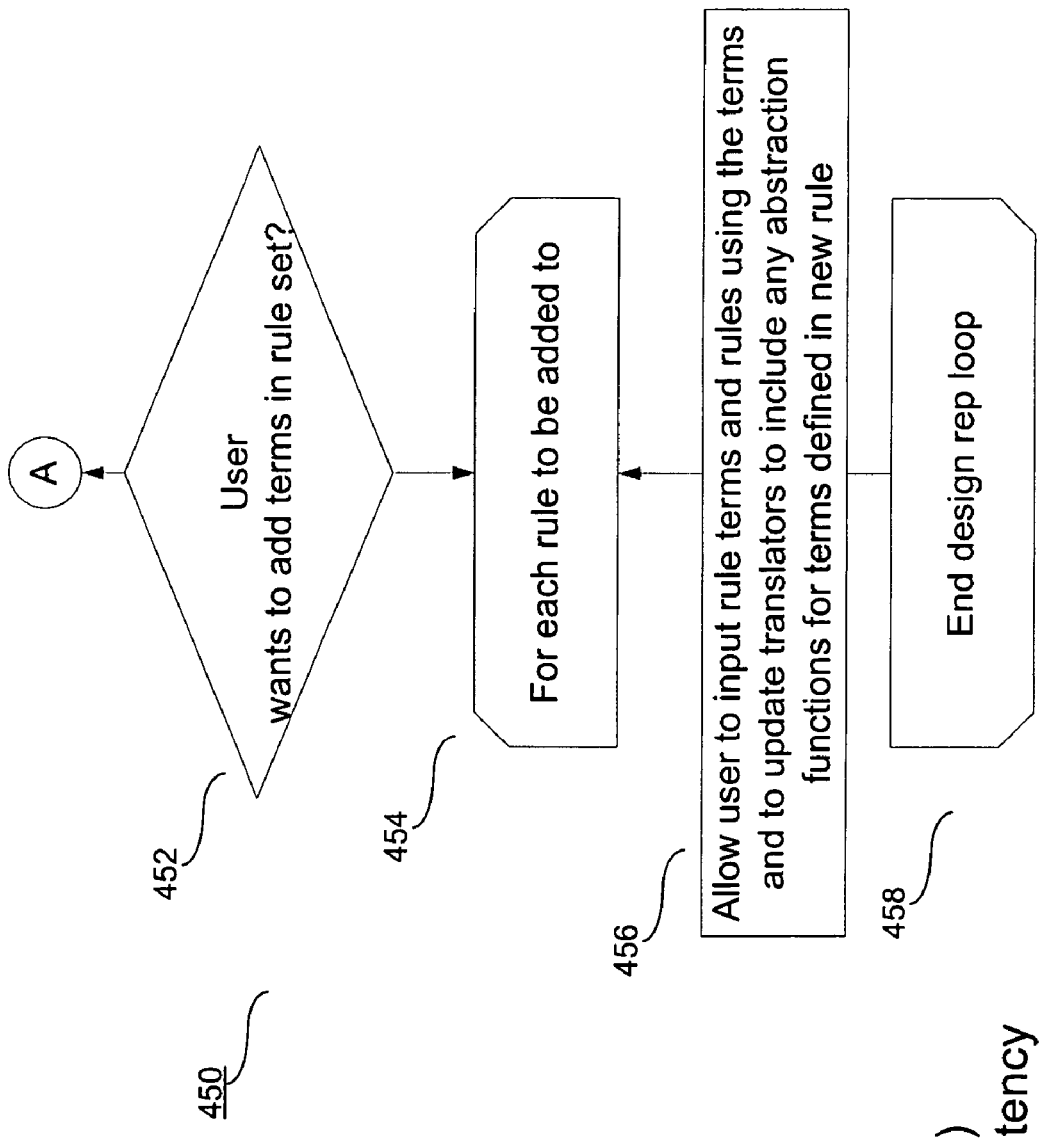

FIGS. 4(a) and 4(b) are flow charts showing a method of initializing consistency checker 120. In element 402, the user specifies which types of design representations he wants to check in the future. The steps of FIGS. 4(a) and 4(b) are generally performed by an initialization module of checking engine 202, although they can also be performed by a separate toolset that allows users to perform their own modifications on the rules and translators of the consistency checker. Although this discussion assumes that the use is interacting with consistency checker 120, it will be understood that other entities such as multiple users or other software programs could also interact with consistency checker 120.

Assume that the user specifies a design type that has not been part of the consistency checker on this user's system in the past. For example, the user may have recently acquired a new design tool that outputs a type of design representation 124 that he has not used before. Certain initialization operations are needed to allow the consistency checker to accept the new design type. If, in element 404, consistency checker 120 determines that it contains a translator for the specified design type, then control passes to element A of FIG. 4(b). If no translator exists 404 for the specified design type, however, it is necessary to obtain such a translator for each type of design representation without a translator (406, 410). Element 408 shows an example in which the user actually enters or uploads a translator 206 or abstraction function 207 that the user has prepared. Alternately, the user may load a translator 206, 207 that he obtained at the same time he obtained his new tool (prepared and supplied by the tool manufacturer). Alternately, the user may be able to locate and access a translator written by other users or third party companies and available over a network. The important aspect of element 408 is that consistency checker is organized in such a way that a new translator module can be plugged into it, allowing the consistency checker to accept new types of design representations.

FIG. 4(b) shows an example 450 where the user wants to add 452 new rule terms to the consistency checker. As a simple example, suppose that consistency checker 120 was shipped with a rule that allowed a user to check whether inputs were triggered by rising clock edges, but not whether inputs were triggered by falling clock edges. To add such a rule, the user would need to help the translators 206 understand what a falling clock edge was and how to recognize one in the various types of design representations 124. Elements 454, 458 loop through each new term that the user desires to add 456 to his rule set. Once each of the translators 206 "understand" and can extract information relating to a term, the term can be added to the terms available in the rule set. For example, the term would be displayed with the other terms available to the set in area 508 of FIG. 5.

FIG. 6 shows an example user interface 650 used to allow a user to add a new term 651 to a rule set. In the example, the user enters 652 a term (such as "falling clock edge") that has not existed before but that he wishes to use in a new rule. The user also enters or specifies the names of translators 206 (or downloadable abstraction functions that can be added to translators) that will allow each type of translator in the system to recognize the new rule term. Last, the user specifies 656 which rule set(s) 122 are to allow rules with the new term.

The following paragraphs provide specific examples of rules, design types, and abstraction functions 207 for the rules 122. It will be understood by persons of ordinary skill in the art that it is not possible to provide an exhaustive list of all possible design types or of all possible rules or rule terms. As new design types are brought to market or otherwise introduced, new translators 206 for those design types will be introduced. Similarly, new rules to check for consistency problems that did not exist before the new design types will be introduced and made available to circuit designers using consistency checkers. For examples of common test rules, see Chapter 5, "RTL Coding Guidelines", Section 5.4, in the "Reuse Methodology Manual" by Michael Keating and Pierre Bricaud, which is herein incorporated by reference. This document provides some examples of rules that might be included in a typical rule set usable with an embodiment. In an embodiment, rules 122 cover syntax, and semantics of the design representations.

For example a rule set 122b might include the syntactic rule that parameters in functions calls in the design representations each contain the same number and types of parameters. These rules are collectively referred to as "signature checking." As another example, a rule set 122 might include the semantic rule that a design representation must trigger all events on a rising clock edge. For a rule to be checkable by a consistency checker, a translator 206 must exist that extracts the terms in the rule from all existing types of design representations (unless the design type is flagged as an exception to this requirement, which is done in some embodiments).

FIG. 7(a) shows a portion of an example design representation written in the C programming language. Specifically, the body of the example C language design representation reads as follows:

```
int Cmodel(...)
{vpiHandle inh, outh, clkh;
inh = vpi_scan (xx,...)
outh = vpi_scan (xx, ...)
clkh = vpi_scan(XX,...)
...
vpi_register(clkh, "risingedge", clkfn);
...
}
```

In FIG. 7(a), a function "clkfn" is as follows:

```
int clkfn(...)
{
    s_vpi_value inv;
...
vpi_get_value(inh,&inv);
...
}
```

In the example 700 of FIG. 7(a), the C code calls predefined library functions that allow the C code to interact with Verilog RTL. For example, functions vpi_scan 704, vpi_register 706, and vpi_get_value 710 are calls to vpi library functions in IEC/IEEE 61691-4-2004 "Verilog Programming Language Interface Standard," which is herein incorporated by reference. The vpi_handle type 702 declares the variables inh, outh, and clkh to be "handles" that hold returned values from other vpi functions. A vpi_register call 706 registers a callback to the function clkfn 708, which includes the vpi_get_value function call 710 which places a value in the handle inh.

FIG. 7(b) shows a portion 750 of an example design representation written in the Verilog RTL hardware description language. Specifically, the Verilog RTL design representation reads as follows:

```
module Vmodel (in, out, clk) ;
input in;
output out; reg out;
input clk;
...
always @(posedge clk) out=in ;
...
endmodule
```

The examples of a design representation in the design type C (FIG. 7(a)) and in the design type Verilog RTL (FIG. 7(b)) are presented here so that an example of an abstraction function 207 can be discussed for each design type. For example if the rule set 122 includes a term "inputs triggered on rising edge," the term must correspond to abstraction functions 207 in translators 206 for each possible design type in the system (C and Verilog RTL).

Figures 8A, 8B:
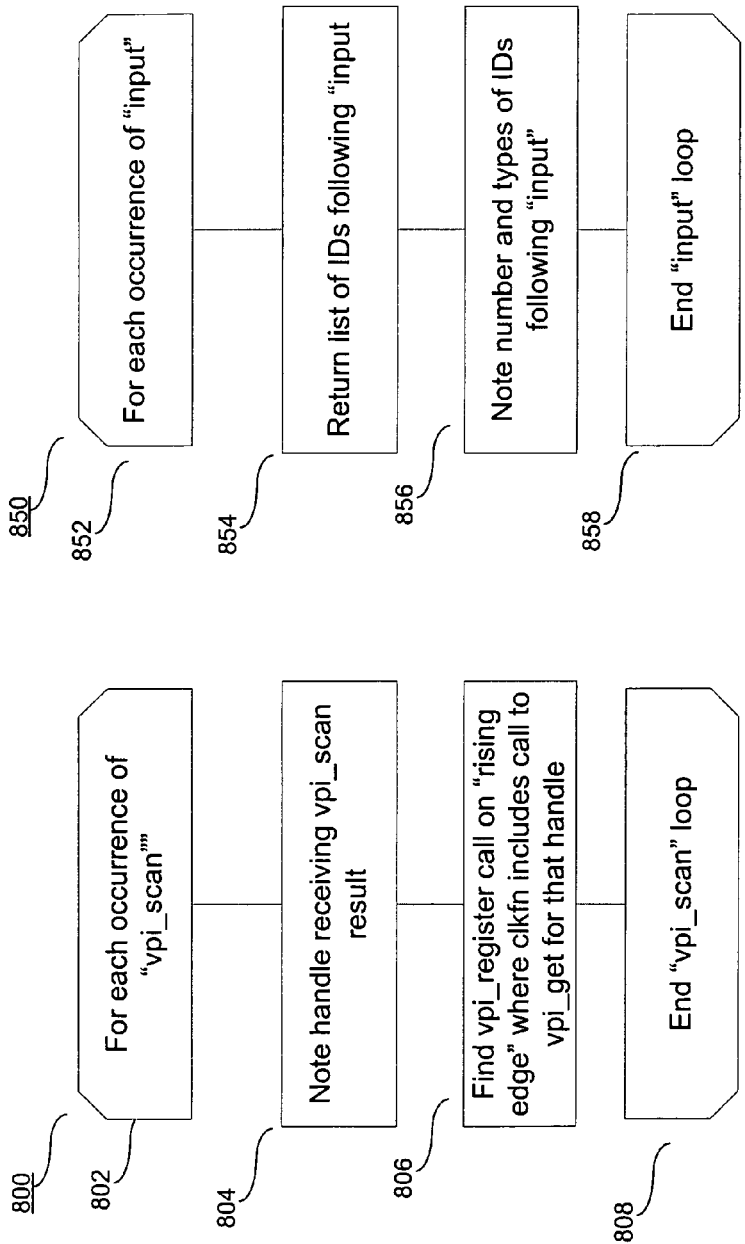
FIG. 8(a) is a flowchart showing an example abstraction function used in a translator for design types of the C programming language.
FIG. 8(b) is a flowchart showing an example abstraction function used in the translator for design types of the Verilog hardware description language.

FIG. 8(a) is a flowchart 800 showing an example abstraction function 207 used in a translator 206 for design types of the C programming language of FIG. 7(a). FIG. 8(b) is a flowchart 850 showing an example abstraction function 207 used in the translator 206 for design types of the Verilog RTL hardware description language of FIG. 7(b).

In FIG. 8(a), an abstraction function 800 in the translator 206 for design type C performs the following in loop 802, 808 to find inputs triggered by a rising clock edges:

For each occurrence of vpi_scan 704 (here, for in, out, and clock), note the handle receiving the vpi_scan 704 result (for example, "inh") (see element 804).

Find the vpi_register call 706 containing "risingedge" and clkfn 707, which calls clkfn 708. Clkfn 708 includes a call to vpi_get_value 710 for that handle (see element 806). The abstraction function of FIG. 8(a) identifies which inputs are sampled on the rising edge of the clock.

In FIG. 8(b), an abstraction function 850 in the translator for design type Verilog RTL performs the following in loop 852, 858 to find inputs triggered by a rising clock edges:

For each occurrence of "input" (752, 754), return a list of IDs following "input" (see element 854). Next, note the number and types of IDs following input (element 856.

Next, "always @(posedge clk)" identifies events that occur on a positive clock edge 756.

The abstraction function of FIG. 8(a) identifies which inputs are active on their rising edge.

Table 1 shows additional examples of terms that can be used to make rule set 122. These examples are not to be taken in a limiting sense and Table 1 is herein incorporated by reference. It will be understood that other embodiments can include different rules and terms, more rules and terms, or fewer rules and terms.

Although the description herein represent several embodiments, various modifications can be made. Accordingly, the description is intended to be illustrative, but not limiting, of the scope of the invention.

TABLE 1

Table 1 provides examples of some terms and rule descriptions that may be included in some embodiments. Examples of terms and descriptions that can be used in some embodiments are described in other tools, such as the Mentor Graphics Inc. tool called 0-In Check ™. Importantly, in some embodiments of the invention, the terms below can be checked across multiple representations of a design. Other embodiments may include more, or fewer terms, or differing subsets of these and other terms.

Arithmetic overflow error - Checks that arithmetic assignments to variables cannot overflow or underflow the variables.
Register race violation - Ensures no register assignment generates a circuit with a potential race condition.
Multiply-driven register/latch - Ensures no register or latch is driven by more than one source.
Unreachable block - Ensures all blocks of code can be reached
Unconnected port - Ensures all ports are connected.
Undriven logic - Ensures every register input can be driven by the design's primary inputs.
Variable declared, but not used
Variable declared, but not assigned
Variable assigned from multiple processes
Implicit variable declaration
Mismatched widths in assignment
Mismatched widths in port connection
Null port connection
Multiple occurrences of port in module port list
Instantiation specifies fewer ports than module definition
Type real may not be synthesizable
Hierarchical reference may not be synthesizable
Specify block may not be synthesizable
UDP may not be synthesizable
Force/release may not be synthesizable
Duplicate case branch expression violates parallel_case
X or Z value on the right-hand side of assignment
Delay in non-blocking assignment
Constant one delay TABLE 1-continued Table 1 provides examples of some terms and rule descriptions that may be included in some embodiments. Examples of terms and descriptions that can be used in some embodiments are described in other tools, such as the Mentor Graphics Inc. tool called 0-In Check ™. Importantly, in some embodiments of the invention, the terms below can be checked across multiple representations of a design. Other embodiments may include more, or fewer terms, or differing subsets of these and other terms.

Constant zero delay
Constant negative delay
Instance port connections not by name
Case statement has no default
Case statement not fully specified
Redundant case branch expressions
Overlapping case branch expressions
Regular-expression based naming convention checks
Uppercase/lowercase naming conventions
Little endian/big endian bit ordering conventions
Clock origin is gated
Clock origin is derived from sequential logic
Asynchronous set/reset controls are derived from sequential logic
Multiple clock domains
Unreachable states
Redundant states
Terminal states
FSMs that do not have a reset transition
Read-write race detection
Write-write race detection
Trigger propagation race detection
UDP race detection
Loop detection
Bus conflicts
Floating bus
Branch possible
Parallel case
Full case
Multi-cycle initialization
Set-reset conflicts
Parity
State transition
Write-Write
Read-Write
Latch-Latch
Combinational loop
Clock gating races
Clock domain boundary crossings
Synchronization of data
Use of specified synchronization cells
Dead-end/terminal states
Self-loop terminal states
Unreachable states
Coding style
Reuse Methodology Manual (RMM)
Simulation-synthesis mismatches
Synthesis compatibility
Implied latches
RTL scan-path DFT checks
RTL ATPG checks
Clock gating
Asynchronous sets/resets
Asynchronous clocks
Lint checks
X-source problems
Redundant logic
Conflicting assignments
Range Violation
Non-resettable flip-flops

What is claimed is:

1. A method comprising:
receiving a first design representation of a first design type;
receiving a second design representation of a second design type;
applying a first translator for the first design type to the first design representation to yield first information about a predetermined aspect of the first design representation;

applying a second translator for the second design type to the second design representation to yield second information about the predetermined aspect of the second design representation;

evaluating at least one consistency rule of a consistency rule set in accordance with the first and second information, the evaluation process not knowing the design types from which the first and second information was obtained;

allowing a user to add a new term to the consistency rule set; and responsive to the user adding a new term, requiring that the user add an abstraction function for the new term for the first design type to the first translator and an abstraction function for the new term for the second design type to the second translator.

2. The method of claim 1, wherein the first translator includes an abstraction function for a rule term that is specific to the first design type.

3. The method of claim 1, wherein the first design type is Verilog RTL.

4. The method of claim 1, wherein the first design type is C.

5. The method of claim 1, wherein a first design type is Verilog RTL and an abstraction function for the new term and for Verilog RTL is stored in a memory.

6. The method of claim 1, wherein a first design type is C and an abstraction function for the new term and for Verilog RTL is stored in a memory.

7. A computer-implemented method, comprising:
receiving a plurality of design representations, each design representation of the plurality of design representations having a different design type of a plurality of design types;
for each rule in a set of rules:
for each different design type of the plurality of design types:
applying a translator that corresponds to the different design type to the design representation of the different design type to obtain information required to apply the rule; and
evaluating the rule in accordance with the obtained information;
allowing a user to add a new term to the set of rules; and
requiring that the user add, for each different design type, an abstraction function for the new term to the translator that corresponds to the different design type, in response to the user adding the new term.

8. The method of claim 7, wherein the translator that corresponds to the different design type includes an abstraction function for a rule term that is specific to the different design type.

9. The method of claim 7, wherein at least one design type of the plurality of design types is Verilog RTL.

10. The method of claim 7, wherein at least one design type of the plurality of design types is C.

11. An apparatus comprising:
means for receiving a first design representation of a first design type;
means for receiving a second design representation of a second design type;
means for applying a first translator for the first design type to the first design representation to yield first information about a predetermined aspect of the first design representation;
means for applying a second translator for the second design type to the second design representation to yield second information about the predetermined aspect of the second design representation;
means for evaluating at least one consistency rule of a consistency rule set in accordance with the first and second information, the evaluation process not knowing the design types from which the first and second information was obtained;
means for allowing a user to add a new term to the consistency rule set; and
means for requiring, responsive to the user adding a new term, that the user add an abstraction function for the new term for the first design type to the first translator and an abstraction function for the new term for the second design type to the second translator.

12. The apparatus of claim 11, wherein the means for applying a first translator includes means for performing an abstraction function for a rule term that is specific to the first design type.

13. The apparatus of claim 11, wherein the first design type is Verilog RTL.

14. The apparatus of claim 11, wherein the first design type is C.

15. The apparatus of claim 11, wherein a first design type is Verilog RTL and an abstraction function for the new term and for Verilog RTL is stored in a memory.

16. The apparatus of claim 11, wherein a first design type is C and an abstraction function for the new term and for Verilog RTL is stored in a memory.

17. A system comprising:
a memory for storing a first design representation of a first design type;
a memory for storing a second design representation of a second design type; and a processor, configured to perform the following:
applying a first translator for the first design type to the first design representation to yield first information about a predetermined aspect of the first design representation;
applying a second translator for the second design type to the second design representation to yield second information about the predetermined aspect of the second design representation;
evaluating at least one consistency rule of a consistency rule set in accordance with the first and second information, the evaluation process not knowing the design types from which the first and second information was obtained;
allowing a user to add a new term to the consistency rule set; and
responsive to the user adding a new term, requiring that the user add an abstraction function for the new term for the first design type to the first translator and an abstraction function for the new term for the second design type to the second translator.

18. One or more computer-readable media, which are volatile or non-volatile memory, containing instructions that are executable to perform actions comprising:
receiving a first design representation of a first design type;
receiving a second design representation of a second design type;
applying a first translator for the first design type to the first design representation to yield first information about a predetermined aspect of the first design representation;
applying a second translator for the second design type to the second design representation to yield second information about the predetermined aspect of the second design representation;

evaluating at least one consistency rule of a consistency rule set in accordance with the first and second information, the evaluation process not knowing the design types from which the first and second information was obtained;

allowing a user to add a new term to the consistency rule set; and responsive to the user adding a new term, requiring that the user add an abstraction function for the new term for the first design type to the first translator and an abstraction function for the new term for the second design type to the second translator.

19. A computer-implemented method, comprising:

receiving a plurality of design representations, each design representation of the plurality of design representations having a different design type of a plurality of design types;

for each rule in a set of rules:

for each different design type of the plurality of design types:

applying a translator that corresponds to the different design type to the design representation of the different design type to obtain information required to apply the rule; and evaluating the rule in accordance with the obtained information;

allowing a user to add a new term to the set of rules and requiring that the user add, for each different design type, an abstraction function for the new term to each translator that corresponds to each different design type in response to the user adding the new term; and allowing a user to add a new design type to the plurality of design types, determining whether a translator that corresponds to the new design type exists, and, if not, obtaining such translator.

\* \* \* \* \*